United States Patent
Mori

(10) Patent No.: US 11,636,888 B2
(45) Date of Patent: Apr. 25, 2023

(54) MEMORY SYSTEM AND OPERATION METHOD THEREOF

(71) Applicant: Winbond Electronics Corp., Taichung (TW)

(72) Inventor: Kaoru Mori, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 38 days.

(21) Appl. No.: 17/505,664

(22) Filed: Oct. 20, 2021

(65) Prior Publication Data

US 2022/0122645 A1 Apr. 21, 2022

(30) Foreign Application Priority Data

Oct. 21, 2020 (JP) .............................. JP2020-176467

(51) Int. Cl.
| | | |
|---|---|---|
| *G11C 7/22* | (2006.01) | |
| *G11C 7/20* | (2006.01) | |
| *G11C 8/18* | (2006.01) | |
| *G11C 8/06* | (2006.01) | |
| *H03K 19/17728* | (2020.01) | |
| *H03K 19/017* | (2006.01) | |

(52) U.S. Cl.
CPC ................. *G11C 8/18* (2013.01); *G11C 7/20* (2013.01); *G11C 7/222* (2013.01); *G11C 8/06* (2013.01); *H03K 19/01742* (2013.01); *H03K 19/17728* (2013.01)

(58) Field of Classification Search
CPC .. G11C 7/20; G11C 7/222; G11C 8/06; G11C 8/18; H03K 19/01742; H03K 19/17728

USPC ...................................................... 365/233.1
See application file for complete search history.

(56) References Cited

U.S. PATENT DOCUMENTS

| | | | |
|---|---|---|---|
| 7,872,936 B2 | 1/2011 | Blankenship | |
| 11,011,213 B2* | 5/2021 | Matsui | ................ G11C 11/4093 |
| 11,024,400 B2* | 6/2021 | Kim | ........................ G11C 5/063 |
| 2005/0082664 A1* | 4/2005 | Funaba | .................. H01L 23/544 |
| | | | 257/E23.179 |

FOREIGN PATENT DOCUMENTS

| | | |
|---|---|---|
| CN | 102543189 | 7/2012 |
| TW | 201209842 | 3/2012 |

* cited by examiner

*Primary Examiner* — Son L Mai
(74) *Attorney, Agent, or Firm* — JCIPRNET

(57) ABSTRACT

A memory system includes memory chips connected to each other. Each of the memory chips includes a memory array, a read/write data strobe pin, a look-up table storage device, a chip number identification circuit, and a control logic circuit. The memory array stores data. The read/write data strobe pin is connected to read/write data strobe pins of other memory chips. The look-up table storage device stores a plurality of trimming shift values related to a number of chip connections in advance. The chip number identification circuit identifies a current number of chip connections according to a state information, and finds a selected trimming shift value from the look-up table storage device. The control logic circuit transmits a data signal in response to a clock signal, and adjusts a setup hold time between the clock signal and the data signal according to the selected trimming shift value.

18 Claims, 14 Drawing Sheets

| Sequence | S1T | S2T | SF |
|---|---|---|---|
| State | RDY | Monitor | FIN |

| | | |
|---|---|---|
| N0 conduction degree | | DS=100ohm |
| P1 conduction degree | | DS=200ohm |
| P2 conduction degree | | DS=67ohm |
| P3 conduction degree | | DS=19ohm |
| RWDS pin Hi-z | | 0.88 * VDD | Hi-z |
| Voltage range (per chip) | | > 0.775 * VDD | |

FIG. 7

| Sequence | S1T | S2T | SF |
|---|---|---|---|
| State | RDY | Monitor | FIN |

| | | |
|---|---|---|
| PD0 | off | on | off |
| PD1~PD3 | off | | |
| PU0~PU3, SW0~SW3 | off | on | off |
| RWDS pin Hi-z | | 0.67 * VDDQ | Hi-z |
| Voltage range (per chip) | | > 0.635 * VDD | |

FIG. 10

MEMORY SYSTEM AND OPERATION METHOD THEREOF

CROSS-REFERENCE TO RELATED APPLICATION

This application claims the priority benefit of Japan application serial no. 2020-176467, filed on Oct. 21, 2020. The entirety of the above-mentioned patent application is hereby incorporated by reference herein and made a part of this specification.

BACKGROUND OF THE INVENTION

Field of the Invention

The invention relates to a memory system, and more particularly to a memory system including a plurality of stacked memory chips and an operation method thereof.

Description of Related Art

In response to the demand for miniaturization, the package structure of the conventional memory system includes a plurality of stacked memory chips to increase memory density. In the memory system of HyperRAM interface, among a plurality of memory chips, the CS# pin, CK pin, DQ pin, RWDS pin, and RESET# pin of one memory chip are respectively connected to the CS# pin(s), CK pin(s), DQ pin(s), RWDS pin(s), and RESET# pin(s) of the other memory chip(s) to share the signal on the pins. Each memory chip may receive a different chip identification signal DIE_STK to perform corresponding operations.

Since the input capacitance of the CK pin is different from the input capacitance of the DQ pin, there is an input timing skew between the clock signal and the data signal. To compensate for the input timing skew, for example, the desired setup hold time (tIS/tIH) between the pulse signal on the CK pin and the data signal on the DQ pin may be stored via a non-volatile laser fuse or electronic fuse structure.

As the number of memory chips stacked together is increased, the input capacitance difference between the CK pin and the DQ pin becomes larger, resulting in a change in the desired setup hold time. However, when a laser fuse is used, the setup hold time needs be stored in the laser fuse before the chip separation procedure, and therefore may not be adjusted arbitrarily after the chip separation procedure. In the case of using an electronic fuse, the area of the programming circuit is increased, and additional procedures are needed to program the electronic fuse before shipment. As a result, there are restrictions on chip manufacture and inventory.

SUMMARY OF THE INVENTION

The invention provides a memory system that may dynamically adjust setup hold time, thereby avoiding the limitation of chip manufacture and inventory.

A memory system of the invention includes a plurality of memory chips connected to each other. Each of the memory chips includes a memory array, a read/write data strobe pin, a look-up table storage device, a chip number identification circuit, and a control logic circuit. The memory array stores a data. The read/write data strobe pin is connected to read/write data strobe pins of other memory chips. The look-up table storage device stores a plurality of trimming shift values related to a number of chip connections in advance. The chip number identification circuit identifies a current number of chip connections according to a state information, and finds a selected trimming shift value from the look-up table storage device accordingly. The control logic circuit transmits a data signal in response to a clock signal, and adjusts a setup hold time between the clock signal and the data signal according to the selected trimming shift value.

An operation method of a memory system of the invention is applicable to a memory system that may include a plurality of memory chips connected to each other. A read/write data strobe pin of each of the memory chips is connected to read/write data strobe pins of other memory chips. The operation method includes the following steps: storing a plurality of trimming shift values related to a number of chip connections in advance; identifying a current number of chip connections according to a state information, and finding a selected trimming shift value from the stored trimming shift values accordingly; and adjusting a setup hold time between a clock signal and a data signal when the data signal is transmitted in response to the clock signal according to the selected trimming shift value.

Based on the above, in the case of a plurality of memory chips stacked in the same package structure, the memory system of the invention may automatically adjust the setup hold time to the most suitable length for different numbers of chip connections, without using a specific fuse. Accordingly, the memory system has greater margin and durability in terms of setup hold time, and the manufacturing process and the shipment control thereof are facilitated, thereby avoiding the limitation of chip manufacture and inventory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 shows a schematic operation diagram of a chip number identification circuit and a control logic circuit of an embodiment of the invention.

FIG. 10 shows a schematic operation diagram of a chip number identification circuit and a control logic circuit of an embodiment of the invention.

DESCRIPTION OF THE EMBODIMENTS

Figure 1:
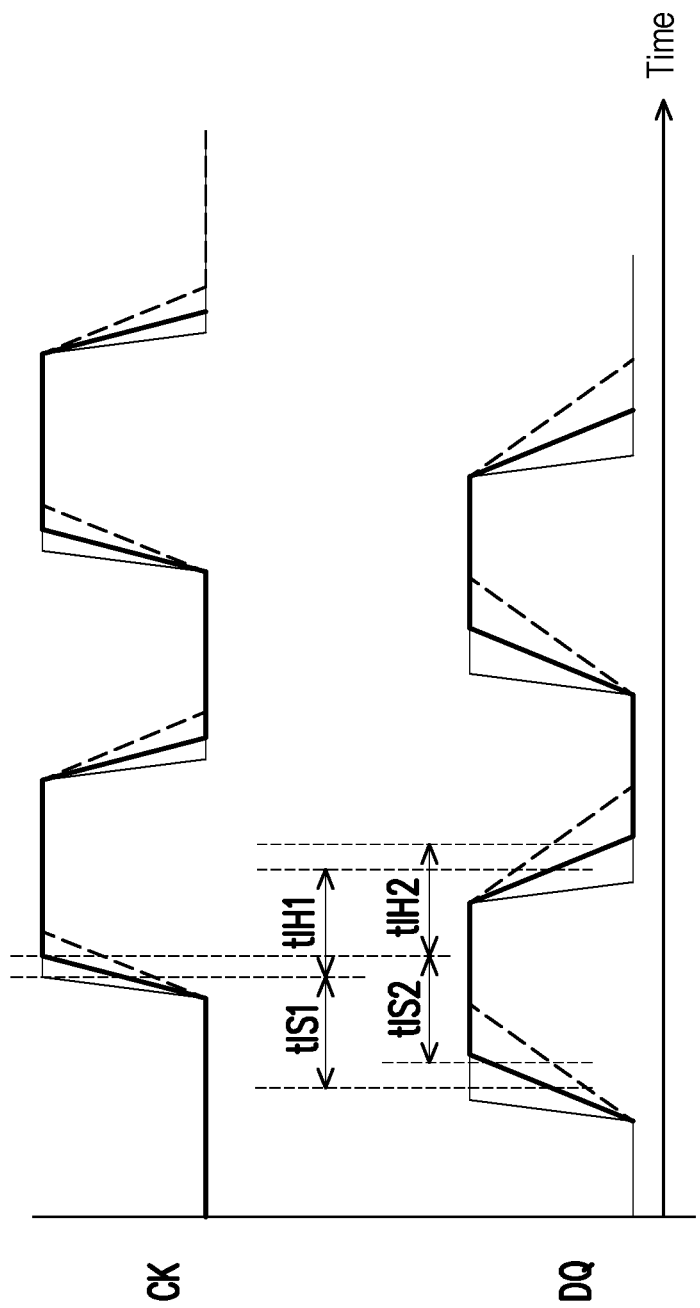
FIG. 1 shows a schematic waveform diagram of a clock signal and a data signal of an embodiment of the invention.

In FIG. 1, the thin solid line represents the waveform of the signal received outside the package structure of the memory system. The thick solid line represents the waveform of the signal received by the memory chip when there is only one memory chip in the package structure. The dotted line represents the waveform of the signal received by memory chips when two memory chips are stacked in the package structure.

Compared with the signal waveform of the thin solid line, the signal waveforms of the thick solid line and the dotted line are delayed by the influence of the input capacitance on the pin, and the delay of a data signal DQ is greater than the delay of a clock signal CK. Observing the relationship between the corresponding setup hold time and the number of memory chips stacked together, it may be seen that a setup time tIS2 for the package structure with two stacked memory chips is less than a setup time tIS1 for the package structure with only one memory chip, and a hold time tIH2 for the package structure with two stacked memory chips is greater than a hold time tIH1 for the package structure with only one memory chip. In this way, depending on the number of memory chips stacked together, the desired setup hold time is also different. To solve the problem, a memory system of the invention may dynamically adjust the setup hold time according to the number of memory chips in the package structure.

Figure 2:
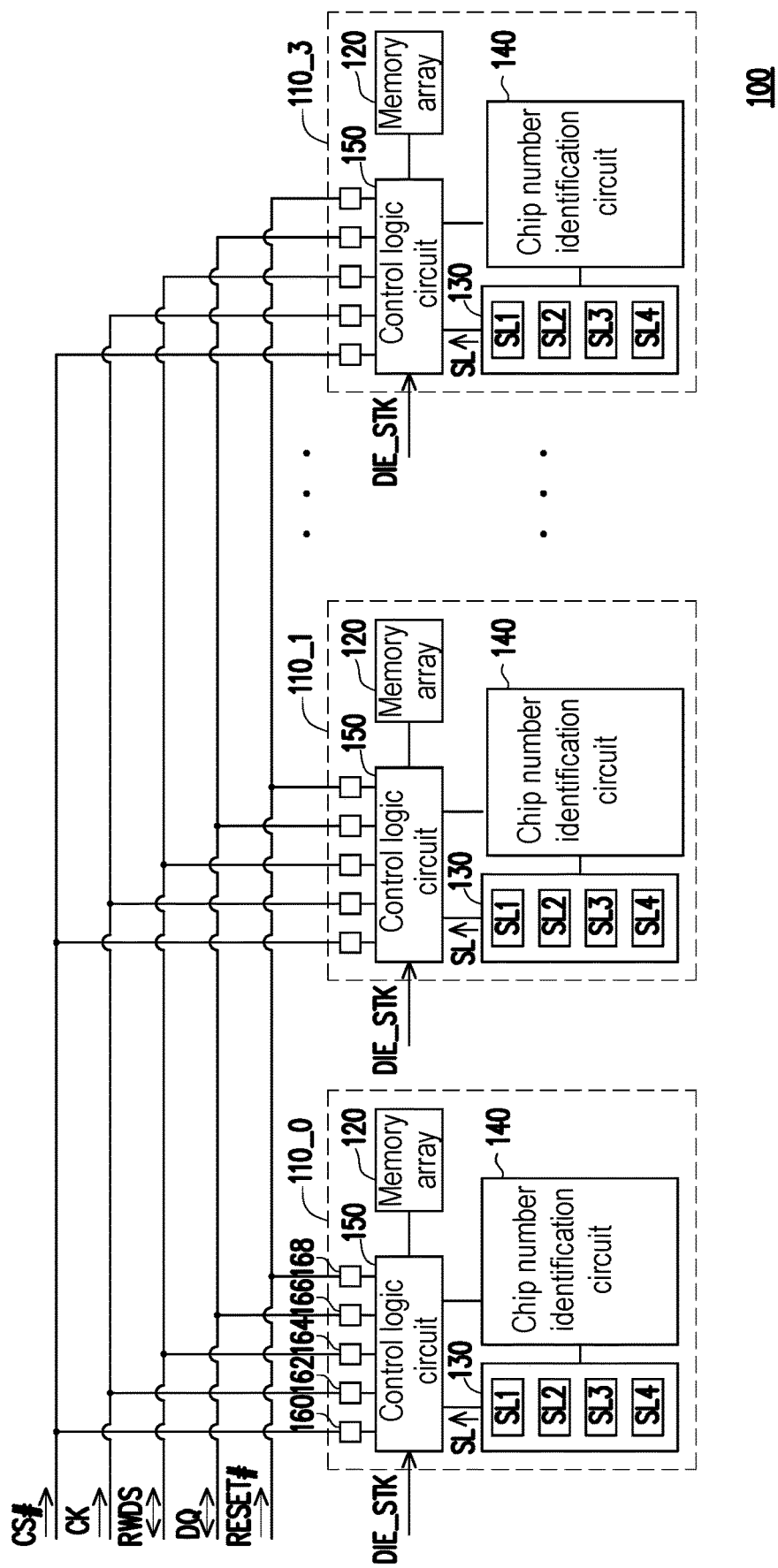
FIG. 2 shows a schematic circuit diagram of a memory system of an embodiment of the invention.

As shown in FIG. 2, a memory system 100 includes a plurality of memory chips 110_0 to 110_3, but the number of memory chips is not intended to limit the invention. Each of the memory chips 110_0 to 110_3 includes a memory array 120, a look-up table storage device 130, a chip number identification circuit 140, and a control logic circuit 150. Each of the memory chips 110_0 to 110_3 includes a CS# pin 160, a clock signal pin (hereinafter referred to as CK pin) 162, a read/write data strobe pin (hereinafter referred to as RWDS pin) 164, a DQ pin 166, and a reset signal pin (hereinafter referred to as RESET# pin) 168 respectively configured to transmit a control signal CS#, a clock signal CK, a read/write data strobe signal RWDS, a data signal DQ, and a reset signal RESET#. And, the CS# pin 160, the CK pin 162, the RWDS pin 164, the DQ pin 166, and the RESET# pin 168 of one memory chip are respectively connected to the CS# pins 160, the CK pins 162, the RWDS pins 164, the DQ pins 166, and the RESET# pins 168 of the other memory chips.

The memory array 120 is configured to store data. The look-up table storage device 130 may store a plurality of trimming shift values SL1 to SL4 related to a number of chip connections in advance. For example, the trimming shift value SL1 is suitable for trimming the setup hold time for the package structure with only one memory chip, the trimming shift value SL2 is suitable for trimming the setup hold time for the package structure with two memory chips, etc. The look-up table storage device 130 may store the trimming shift values SL1 to SL4 in a manner of implementing a look-up table, so as to facilitate quickly finding a suitable trimming shift value according to the current number of chip connections. The memory array 120 may be, for example, a volatile memory device such as a dynamic random-access memory (DRAM), and the look-up table storage device 130 may be, for example, a register and the like that reads and saves the value stored in a non-volatile memory device such as a laser fuse, but the invention is not limited thereto.

The chip number identification circuit 140 is coupled to the look-up table storage device 130. The chip number identification circuit 140 may identify a current number of chip connections according to a state information SI, and find a selected trimming shift value SL from the look-up table storage device 130 accordingly.

The control logic circuit 150 is coupled to the memory array 120, the CS# pins 160, the CK pins 162, the RWDS pins 164, the DQ pins 166, the RESET# pins 168, the look-up table storage device 130, and the chip number identification circuit 140. The control logic circuit 150 may transmit the data signal DQ via the DQ pin 166 in response to the clock signal CK received via the CK pin 162, and adjust the setup hold time between the clock signal CK and the data signal DQ according to the selected trimming shift value SL.

In the present embodiment, the control logic circuit 150 may include, for example, a chip number register that may be configured to store the current number of chip connections and provide the current number of chip connections to the chip number identification circuit 140 as the state information SI. In an embodiment, the current number of chip connections may be stored in the chip number register in advance via any method. In other embodiments of the invention, the control logic circuit 150 may detect the current number of chip connections in real time to generate the corresponding state information SI.

The following Table (1) illustrates an example of the look-up table implemented by the look-up table storage device 130.

TABLE 1

| Number of chip connections | Trimming shift value for setup hold time (unit: 0.15 nanoseconds) |
|---|---|
| 1 | −1 |
| 2 | 0 |
| 3 | +1 |
| 4 | +2 |

For the memory system 100 in which a plurality of memory chips are stacked in the package structure, the setup hold time may be set to match the standard number of chip connections in advance during the design stage. Moreover, in a subsequent stage (such as the trial production stage), the chip number identification circuit 140 may identify a current number of chip connections according to the received state information SI, and find a selected trimming shift value SL from the look-up table storage device 130 accordingly. In the present embodiment, as shown in Table (1), the standard number of chip connections is 2, for example, meaning that at the beginning of the design stage, the setup hold time is configured according to the number of chip connections being 2. Therefore, when the number of chip connections is 2, there is no need to adjust the setup hold time, and the selected trimming shift value SL is 0. The unit of the trimming shift values in Table (1) is, for example, 0.15 nanoseconds. In other words, when the number of chip connections is 1, the selected trimming shift value SL is −0.15 nanoseconds, and when the number of chip connections is 3, the selected trimming shift value SL is +0.15 nanoseconds, and when the number of chip connections is 4, the selected trimming shift value SL is +0.3 nanoseconds.

The chip number identification circuit 140 may control the selected trimming shift value SL to be output to the control logic circuit 150. The control logic circuit 150 may then finely adjust the setup hold time between the clock signal CK and the data signal DQ according to the selected trimming shift value SL. In this way, the function of dynamically adjusting the setup hold time is achieved, thereby avoiding the limitation of chip manufacture and inventory.

Figure 3:
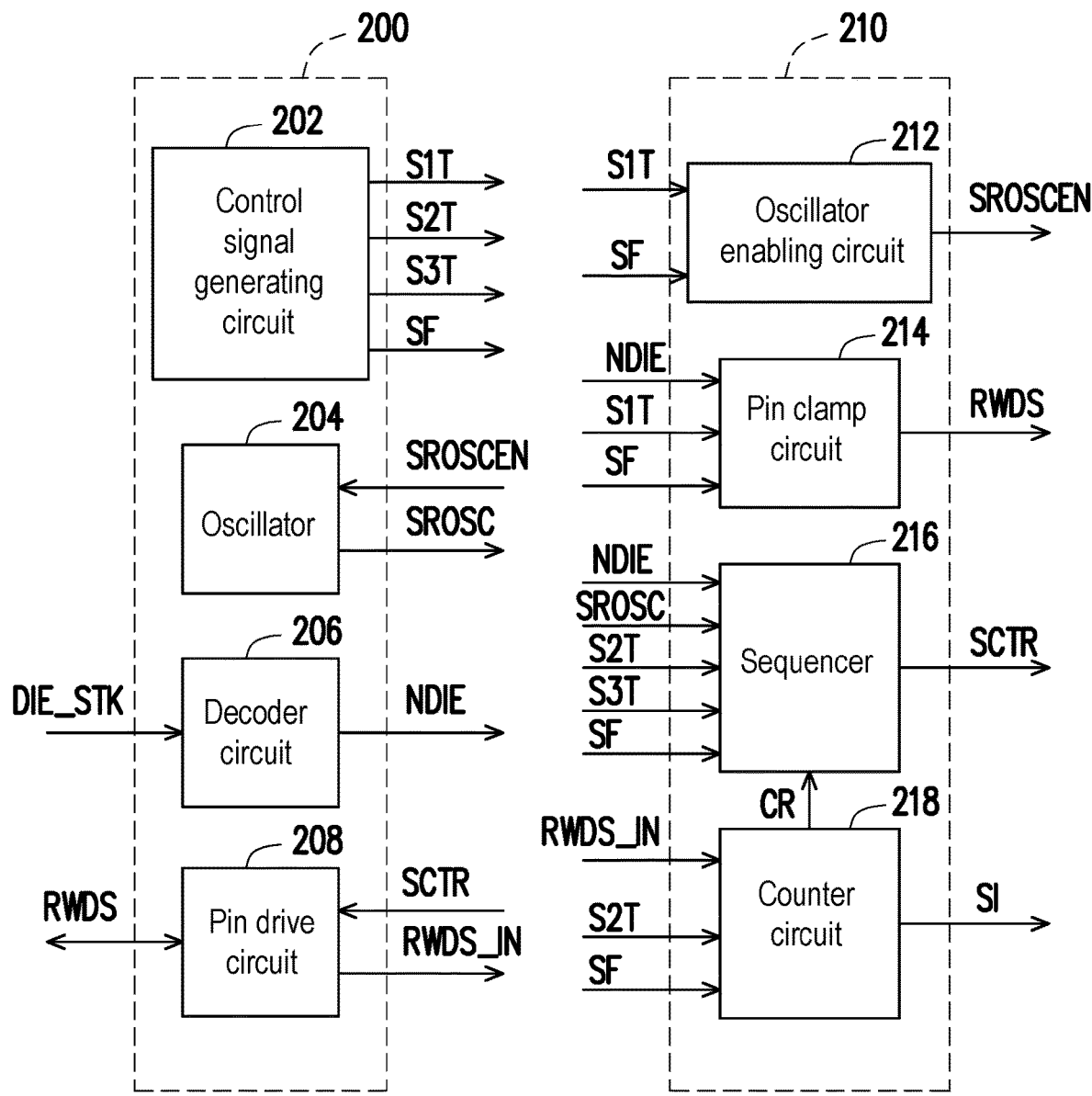
FIG. 3 shows a schematic circuit diagram of a chip number identification circuit and a control logic circuit of an embodiment of the invention.

Referring to FIG. 3, a control logic circuit 200 of the first embodiment of the invention includes a control signal generating circuit 202, an oscillator 204, a decoder circuit 206, and a pin drive circuit 208. A chip number identification circuit 210 includes an oscillator enabling circuit 212, a pin clamp circuit 214, a sequencer 216, and a counter circuit 218.

The decoder circuit 206 may receive the chip identification signal DIE_STK, determine the order of the associated memory chip according to the chip identification signal DIE_STK, and provide a chip decoding signal NDIE accordingly.

The pin drive circuit 208 is coupled to the corresponding RWDS pin 164. The pin drive circuit 208 is controlled by a control signal SCTR of the chip number identification circuit 210 to adjust the voltage level of the RWDS pin 164. Moreover, the read/write data strobe signal RWDS on the RWDS pin 164 may be provided as an input signal RWDS_IN to the counter circuit 218 by the pin drive circuit 208.

Figure 4:
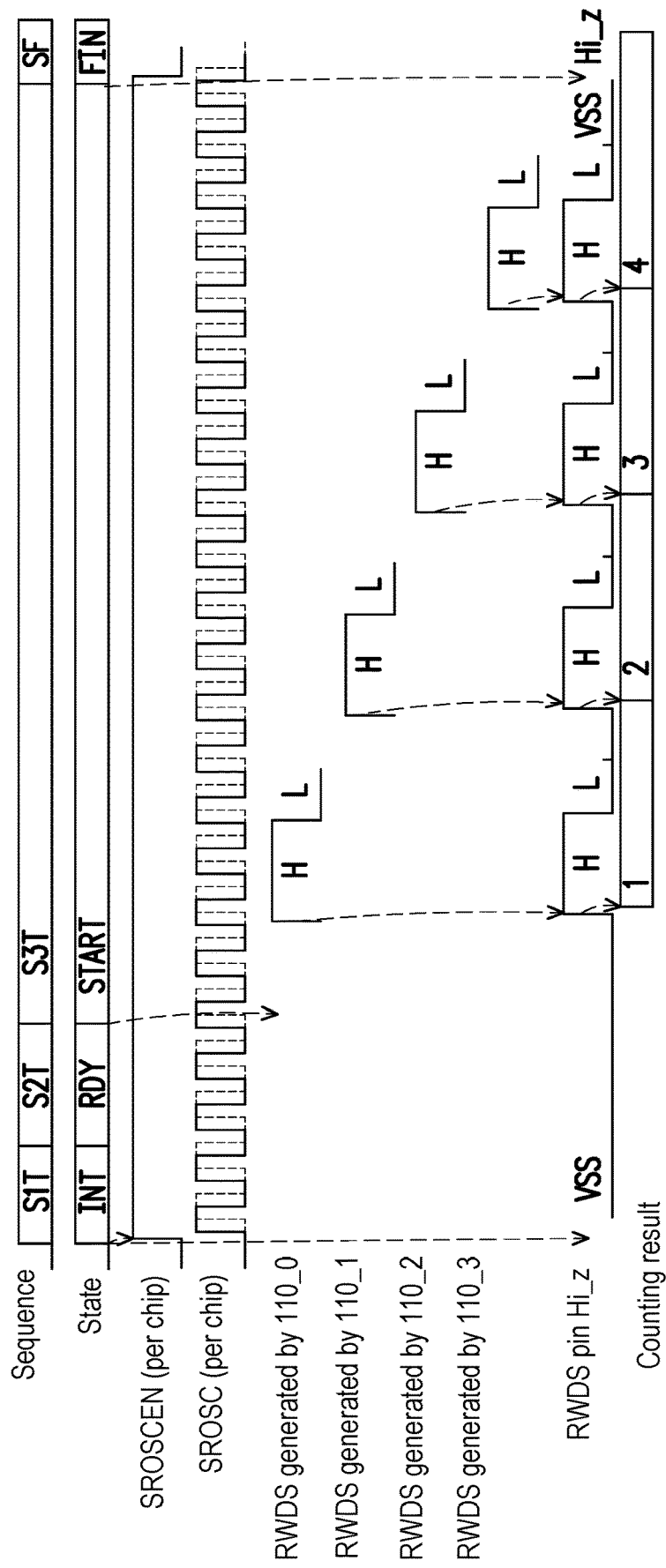
FIG. 4 shows a schematic operation diagram of a chip number identification circuit and a control logic circuit of an embodiment of the invention.

As shown in FIG. 4, when the memory system is activated, during the power on procedure, the control signal generating circuit 202 may provide a first sequence signal S1T, a second sequence signal S2T, a third sequence signal S3T, and an end signal SF (first control signal) to the chip number identification circuit 210 sequentially, so as to control the chip number identification circuit 210 to execute the identification procedure of the number of chip connections.

Please refer to FIG. 2 to FIG. 4 at the same time, in which the operation method of the control logic circuit 200 and the chip number identification circuit 210 of an embodiment of the invention is described. In the present embodiment, the first sequence signal S1T may indicate entering an initial state INT. When the oscillator enabling circuit 212 receives the first sequence signal S1T, the oscillator enabling circuit 212 may output an oscillation enabling signal SROSCEN to the oscillator 204 so that the oscillator 204 provides an oscillation signal SROSC.

The pin clamp circuit 214 is coupled to the corresponding RWDS pin 164. When the pin clamp circuit 214 receives the first sequence signal S1T, the pin clamp circuit 214 may generate the corresponding read/write data strobe signal RWDS according to the chip decoding signal NDIE. Specifically, when the pin clamp circuit 214 determines that the associated memory chip is the first memory chip 110_0 according to the chip decoding signal NDIE, the pin clamp circuit 214 may clamp the corresponding RWDS pin 164 from a high impedance state Hi-Z to a specified voltage VSS (for example, 0 V). When the pin clamp circuit 214 determines that the associated memory chip is one of the second to fourth memory chips 110_1 to 110_3 according to the chip decoding signal NDIE, the pin clamp circuit 214 does not operate.

The second sequence signal S2T may indicate entering a ready state RDY. When the sequencer 216 receives the second sequence signal S2T, the sequencer 216 may provide the control signal SCTR (second control signal) to the pin drive circuit 208 to enable the pin drive circuit 208.

The counter circuit 218 is coupled to the sequencer 216. When the second sequence signal S2T is received, the counter circuit 218 is enabled to start counting the number of switching times of the voltage level of the RWDS pin 164 according to the input signal RWDS_IN.

The third sequence signal S3T may indicate entering a counting state START. When the sequencer 216 receives the third sequence signal S3T, the sequencer 216 may trigger the corresponding pin drive circuit 208 in the corresponding period according to the chip decoding signal NDIE in response to the oscillation signal SROSC. As a result, the pin drive circuit 208 of each memory chip outputs the read/write data strobe signal RWDS to the respective RWDS pin 164 in a predetermined sequence. As shown in FIG. 4, first, during the period corresponding to the memory chip 110_0, the sequencer 216 of the memory chip 110_0 may trigger the pin drive circuit 208 of the memory chip 110_0 to output the read/write data strobe signal RWDS to the RWDS pin 164 thereof according to the chip decoding signal NDIE, so as to switch the voltage level of the RWDS pin 164 thereof (switching between a high logic level H and a low logic level L). Moreover, the counter circuits 218 in the memory chips 110_0 to 110_3 may simultaneously count the number of switching times of the voltage level of the corresponding RWDS pin 164, and transmit a counting result CR to the corresponding sequencer 216.

Next, during the period corresponding to the memory chip 110_1, the sequencer 216 of the memory chip 110_1 may trigger the pin drive circuit 208 of the memory chip 110_1 to output the read/write data strobe signal RWDS to the RWDS pin 164 thereof according to the chip decoding signal NDIE to switch the voltage level of the RWDS pin 164 thereof, and so on, until the sequencer 216 determines that the voltage level of the RWDS pin 164 of all the memory chips is switched according to the chip decoding signal NDIE and the counting result CR.

The end signal SF indicates entering an end state FIN. When the counter circuit 218 receives the end signal SF, the counter circuit 218 may generate the corresponding state information SI according to the final counting result CR stored in the internal register. As a result, the chip number identification circuit 210 may identify the current number of chip connections according to the state information SI, and find the selected trimming shift value SL from the look-up table storage device 130 accordingly. The end signal SF may also cause the chip number identification circuit 210 to end the identification procedure of the number of chip connections.

Figure 5:
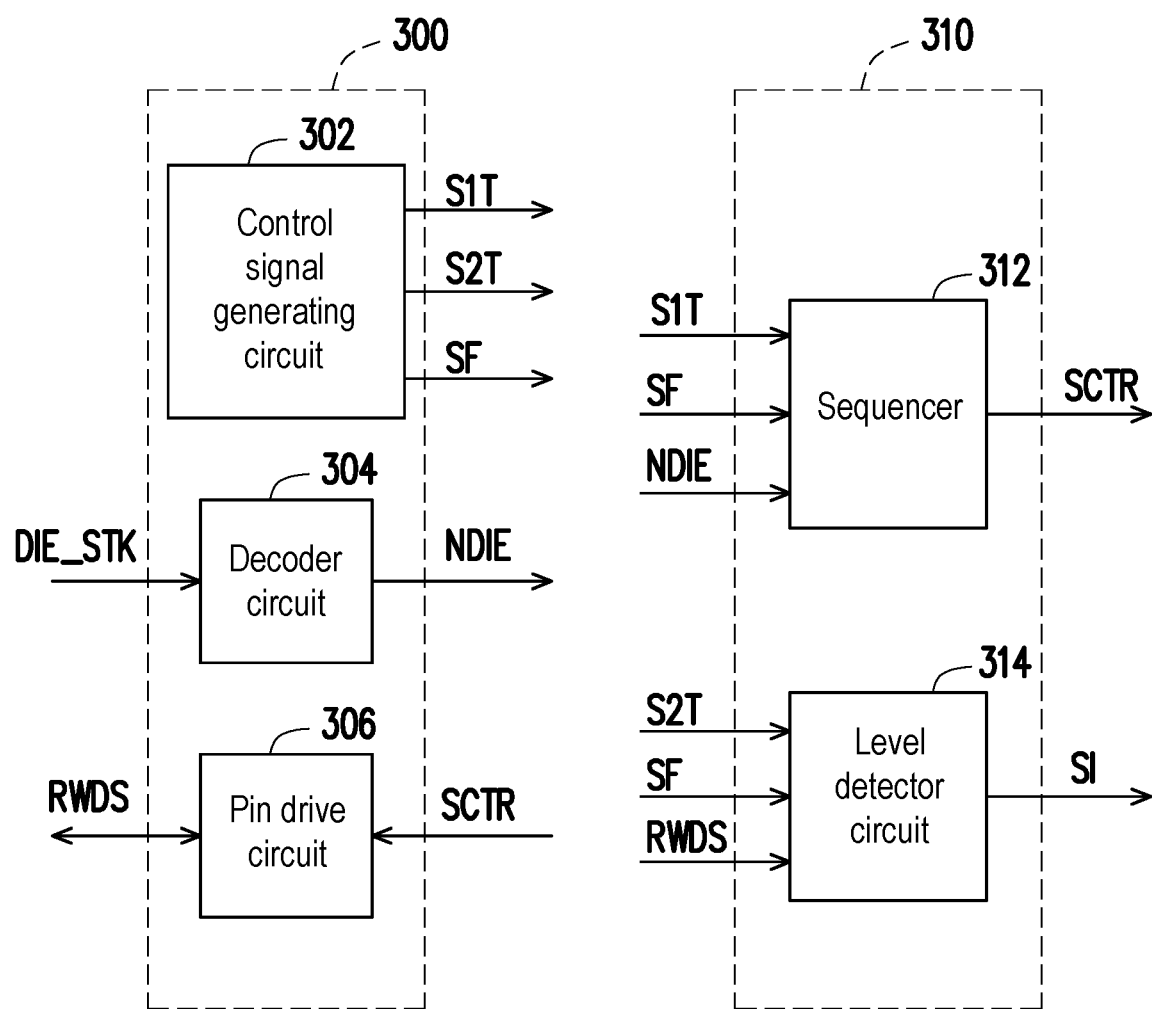
FIG. 5 shows a schematic circuit diagram of a chip number identification circuit and a control logic circuit of an embodiment of the invention.

Referring to FIG. 5, a control logic circuit 300 of the second embodiment of the invention includes a control signal generating circuit 302, a decoder circuit 304, and a pin drive circuit 306. A chip number identification circuit 310 includes a sequencer 312 and a level detector circuit 314.

The decoder circuit 304 may receive the chip identification signal DIE_STK, determine the order of the associated memory chip according to the chip identification signal DIE_STK, and provide the chip decoding signal NDIE accordingly.

The pin drive circuit 306 is coupled to the corresponding RWDS pin 164. The pin drive circuit 306 is controlled by the control signal SCTR generated by the chip number identification circuit 310 to adjust the voltage level of the RWDS pin 164.

Figure 6:
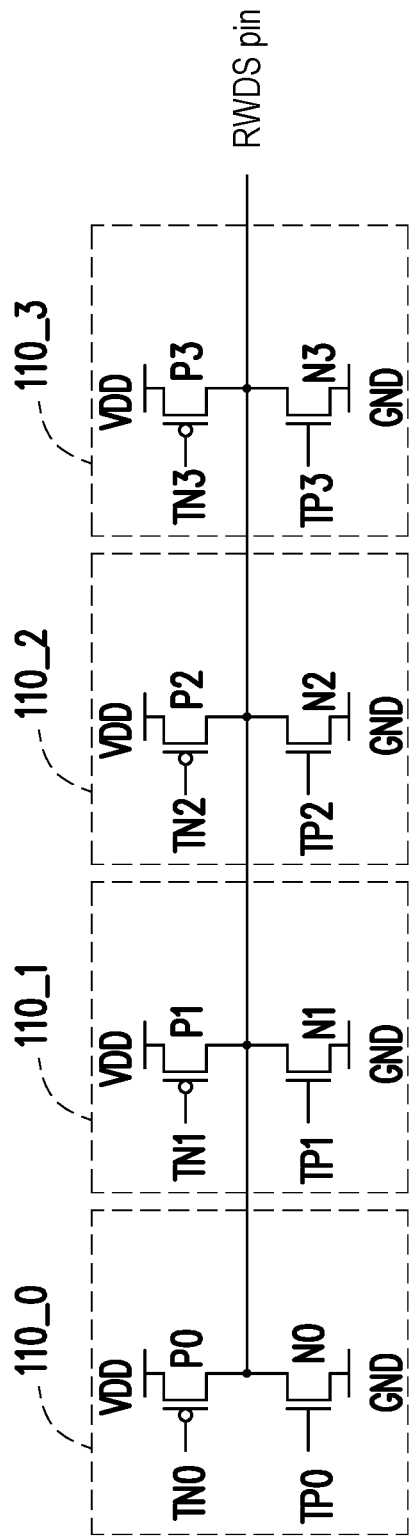
FIG. 6 shows a schematic load circuit diagram of an RWDS pin of an embodiment of the invention.

FIG. 6 shows a schematic load circuit diagram of an RWDS pin of an embodiment of the invention. The pin drive circuit 306 of the memory chip 110_0 includes a P-type field-effect transistor (FET) P0 and an N-type FET N0. The P-type FET P0 has a first terminal for receiving an operating voltage VDD, a second terminal coupled to the corresponding RWDS pin, and a control terminal for receiving a first ON signal TN0. The N-type FET N0 has a first terminal coupled to the corresponding RWDS pin, a second terminal for receiving a ground voltage GND, and a control terminal for receiving a second ON signal TP0.

Similarly, the pin drive circuit 306 of the memory chip 110_1 includes a P-type FET P1 and an N-type FET N1. The pin drive circuit 306 of the memory chip 110_2 includes a P-type FET P2 and an N-type FET N2. The pin drive circuit 306 of the memory chip 110_3 includes a P-type FET P3 and an N-type FET N3. The connection relationship of the transistors in the pin drive circuit 306 of the memory chips 110_1 to 110_3 are identical to the connection relationship of the P-type FET P0 and the N-type FET N0. In addition, the RWDS pins of the memory chips 110_0 to 110_3 are connected to each other.

As shown in FIG. 7, in the present embodiment, when the memory system is activated, during the power on procedure, the control signal generating circuit 302 may provide the first sequence signal S1T, the second sequence signal S2T, and the end signal SF (first control signal) sequentially to control the chip number identification circuit 310 to execute the identification procedure of the number of chip connections.

Please refer to FIG. 2 and FIG. 5 to FIG. 7 at the same time. In the present embodiment, the first sequence signal S1T may indicate entering the ready state RDY. When the sequencer 312 receives the first sequence signal S1T, the sequencer 312 may provide the second control signal SCTR according to the chip decoding signal NDIE.

Moreover, the sequencer 312 of each of the memory chips 110_0 to 110_3 may enable the pin drive circuit 306 via the second control signal SCTR and adjust the conduction degree of the corresponding pin drive circuit 306, so that the pin drive circuit 306 of each of the memory chips 110_0 to 110_3 has a different conduction resistance value. For example, as shown in FIG. 6 and FIG. 7, in the memory chip 110_0, the corresponding sequencer 312 may adjust the P-type FET P0 and the N-type FET N0 included in the pin drive circuit 306 via the second control signal SCTR including the first ON signal TN0 and the second ON signal TP0 to accordingly disconnect the P-type FET P0 and configure the N-type FET N0 to have an ON-resistance value DS of 100 ohms. In the memory chip 110_1, the corresponding sequencer 312 may adjust the P-type FET P1 and the N-type FET N1 included in the pin drive circuit 306 via the second control signal SCTR including a first ON signal TN1 and a second ON signal TP1 to accordingly configure the P-type FET P1 to have an ON-resistance value DS of 200 ohms and disconnect the N-type FET N1. In the memory chip 110_2, the corresponding sequencer 312 may adjust the P-type FET P2 and the N-type FET N2 included in the pin drive circuit 306 via the second control signal SCTR including a first ON signal TN2 and a second ON signal TP2 to accordingly configure the P-type FET P2 to have an ON-resistance value DS of 67 ohms and disconnect the N-type FET N2. In the memory chip 110_3, the corresponding sequencer 312 may adjust the P-type FET P3 and the N-type FET N3 included in the pin drive circuit 306 via the second control signal SCTR including a first ON signal TN3 and a second ON signal TP3 to accordingly configure the P-type FET P3 to have an ON-resistance value DS of 19 ohms and disconnect the N-type FET N3.

The following Table (2) illustrates the relationship between the number of chip connections and the voltage on the RWDS pin 164 after configuring the ON-resistance values.

TABLE 2

| Number of chip connections | Voltage on RWDS pin |
| --- | --- |
| 1 | 0 |
| 2 | 0.33*VDD |
| 3 | 0.67*VDD |
| 4 | 0.88*VDD |

The second sequence signal S2T may indicate entering a monitoring state Monitor. When the level detector circuit 314 receives the second sequence signal S2T, the range of the voltage on the RWDS pin 164 may be determined. For example, when the level detector circuit 314 determines that the range of the voltage on the RWDS pin 164 is between 0 and 0.165*VDD, a number of chip connections of 1 may be stored in the register inside the level detector circuit 314 as the determination result. When the level detector circuit 314 determines that the range of the voltage on the RWDS pin 164 is between 0.165*VDD and 0.5*VDD, a number of chip connections of 2 may be stored in the register inside the level detector circuit 314 as the determination result. When the level detector circuit 314 determines that the range of the voltage on the RWDS pin 164 is between 0.5*VDD and 0.775*VDD, a number of chip connections of 3 may be stored in the register inside the level detector circuit 314 as the determination result. When the level detector circuit 314 determines that the range of the voltage on the RWDS pin 164 is greater than 0.775*VDD, a number of chip connections of 4 may be stored in the register inside the level detector circuit 314 as the determination result. In the embodiment of FIG. 7, since the voltage on the RWDS pin 164 is 0.88*VDD, the level detector circuit 314 may detect that the range of the voltage is greater than 0.775*VDD, thereby determining that the number of chip connections is 4.

The end signal SF indicates entering the end state FIN. When the level detector circuit 314 receives the end signal SF, the level detector circuit 314 may generate the corresponding state information SI according to the determination result stored in the internal register. As a result, the chip number identification circuit 310 may identify the current number of chip connections according to the state information SI, and find the selected trimming shift value SL from the look-up table storage device 130 accordingly. The end signal SF may also cause each device in the chip number identification circuit 310 to end the identification procedure of the number of chip connections.

Figure 8:
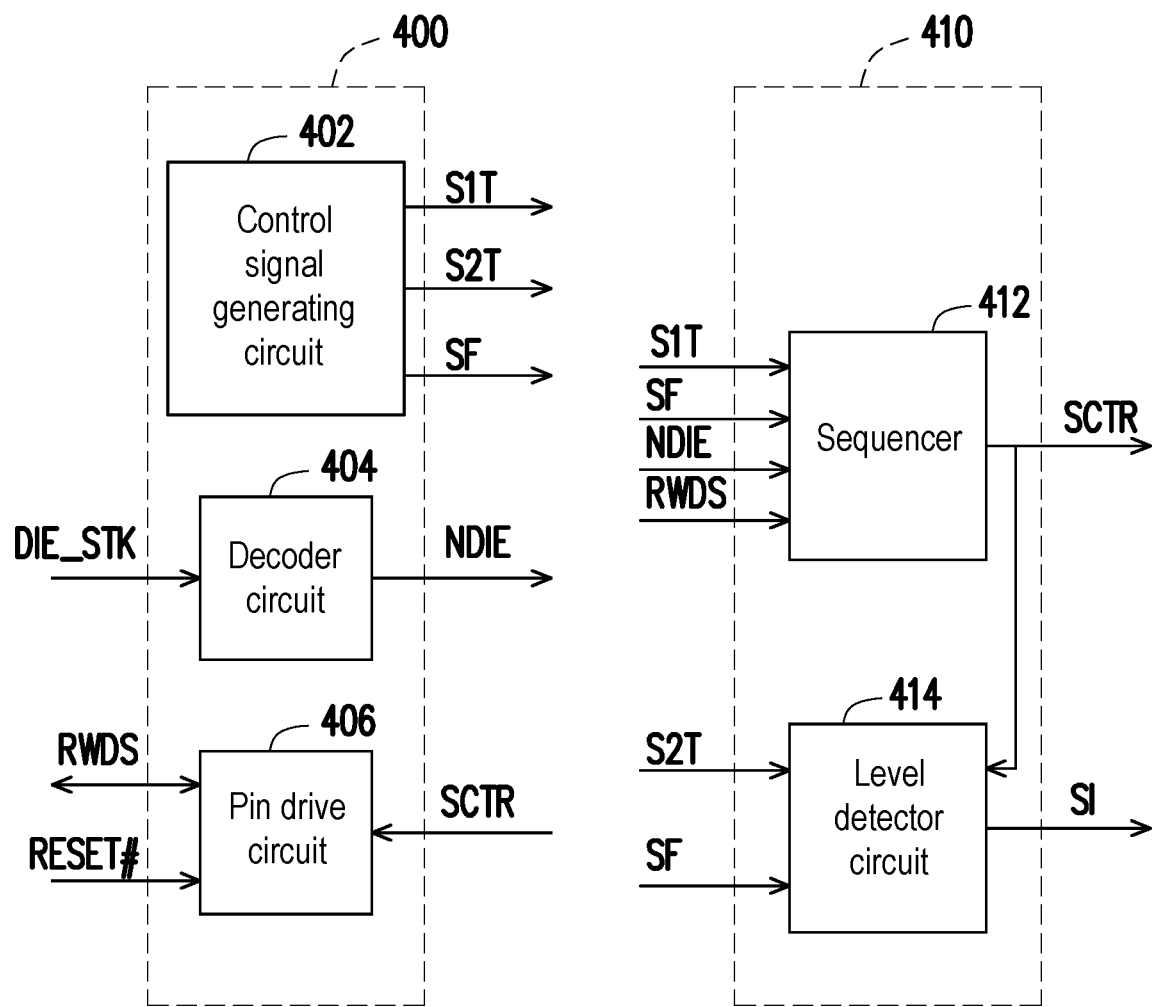
FIG. 8 shows a schematic circuit diagram of a chip number identification circuit and a control logic circuit of an embodiment of the invention.

Referring to FIG. 8, a control logic circuit 400 of the third embodiment of the invention includes a control signal generating circuit 402, a decoder circuit 404, and a pin drive circuit 406. A chip number identification circuit 410 includes a sequencer 412 and a level detector circuit 414.

The decoder circuit 404 may receive the chip identification signal DIE_STK, determine the order of the associated memory chip according to the chip identification signal DIE_STK, and provide a chip decoding signal NDIE accordingly.

The pin drive circuit 406 is coupled to the corresponding RWDS pin 164 and the RESET# pin 168. The pin drive circuit 406 is controlled by the control signal SCTR of the chip number identification circuit 410 to adjust the voltage level of the RWDS pin 164.

Figure 9:
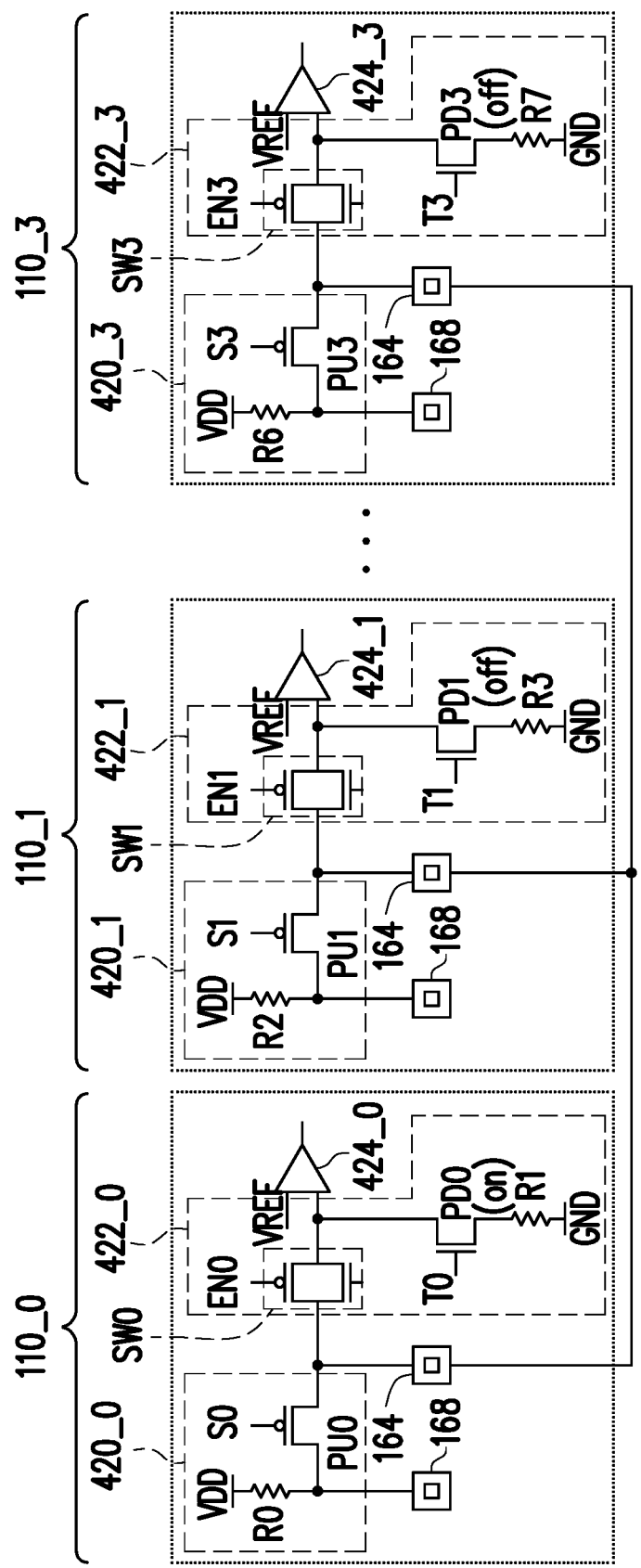
FIG. 9 shows a schematic load circuit diagram of an RWDS pin of an embodiment of the invention.

FIG. 9 shows a schematic load circuit diagram of an RWDS pin of an embodiment of the invention. The pin drive circuit 406 of the memory chip 110_0 includes a pull-up resistor switch circuit 420_0. The pull-up resistor switch circuit 420_0 is coupled to the corresponding RWDS pin 164 and the RESET# pin 168. The pull-up resistor switch circuit 420_0 includes a resistor R0 and a pull-up switch transistor PU0. The resistor R0 has a first terminal coupled to the operating voltage VDD, and a second terminal coupled to the RESET# pin 168 and the first terminal of the pull-up switch transistor PU0. The second terminal of the pull-up switch transistor PU0 is coupled to the RWDS pin 164.

The level detector circuit 414 of the memory chip 110_0 includes a pull-down resistor switch circuit 422_0 and a comparator 424_0. The pull-down resistor switch circuit 422_0 is coupled to the corresponding RWDS pin 164 and the comparator 424_0. The pull-down resistor switch circuit 422_0 includes a resistor R1, a pull-down switch transistor PD0, and a switch SW0. The switch SW0 has a first terminal coupled to the RWDS pin 164, and a second terminal coupled to the first terminal of the pull-down switch transistor PD0 and the first input terminal of the comparator 424_0. The second input terminal of the comparator 424_0 receives a reference voltage VREF. The second terminal of the pull-down switch transistor PD0 is coupled to the first terminal of the resistor R1. The second terminal of the resistor R1 is coupled to the ground voltage GND.

Similarly, the pin drive circuit 406 of the memory chip 110_1 includes a pull-up resistor switch circuit 420_1. The pull-up resistor switch circuit 420_1 includes a resistor R2 and a pull-up switch transistor PU1. The level detector circuit 414 of the memory chip 110_1 includes a pull-down resistor switch circuit 422_1 and a comparator 424_1. The pull-down resistor switch circuit 422_1 includes a resistor R3, a pull-down switch transistor PD1, and a switch SW1. In analogy, the pin drive circuit 406 of the memory chip 110_3 includes a pull-up resistor switch circuit 420_3. The pull-up resistor switch circuit 420_3 includes a resistor R6 and a pull-up switch transistor PU3. The level detector circuit 414 of the memory chip 110_3 includes a pull-down resistor switch circuit 422_3 and a comparator 424_3. The pull-down resistor switch circuit 422_3 includes a resistor R7, a pull-down switch transistor PD3, and a switch SW3. The connection methods of the above devices are all the same as the connection methods of the corresponding devices in the memory chip 110_0. In addition, the RWDS pins 164 of the memory chips 110_0 to 110_3 are connected to each other. The resistors R0, R2, R4, and R6 are, for example, 100 kohms. The resistors R1, R3, R5, and R7 are, for example, 50 kohms.

As shown in FIG. 10, in the present embodiment, when the memory system is activated, during the power on procedure, the control signal generating circuit 402 may provide the first sequence signal S1T, the second sequence signal S2T, and the end signal SF (first control signal) sequentially to control the chip number identification circuit 410 to execute the identification procedure of the number of chip connections.

Please refer to FIG. 2 and FIG. 8 to FIG. 10 at the same time. In the present embodiment, the first sequence signal S1T may indicate entering the ready state RDY. When the sequencer 412 receives the first sequence signal S1T, the sequencer 412 may provide the second control signal SCTR to the pin drive circuit 406 and the pull-down resistor switch circuit in the level detector circuit 414 according to the chip decoding signal NDIE. Specifically, the second control signal SCTR provided by the sequencer 412 of the memory chip 110_0 includes switch signals T0, S0, and EN0. As shown in FIG. 9, the pull-down switch transistor PD0 of the memory chip 110_0 is turned on or off under the control of the switch signal T0. The pull-up switch transistor PU0 is turned on or off under the control of the switch signal S0. The switch SW0 is turned on or off under the control of the switch signal EN0. Similarly, the second control signal SCTR provided by the sequencer 412 of the memory chips 110_1 to 110_3 also includes switch signals T1 to T3, switch signals S1 to S3, and switch signals EN1 to EN3, respectively, and may be configured to control the pull-down resistor switch circuit and the pull-up resistor switch circuit of each of the memory chips 110_1 to 110_3.

Moreover, the sequencer 412 of each of the memory chips 110_0 to 110_3 may enable the pin drive circuit 306 via the second control signal SCTR, and turn on the corresponding pull-up resistor switch circuit and the pull-down resistor switch circuit. For example, when the sequencer 412 of the memory chip 110_0 receives the first sequence signal S1T, the sequencer 412 turns on the pull-down switch transistor PD0 via the switch signal T0, and turns on the pull-up switch transistor PU0 and the switch SW0 via the switch signal S0 and the switch signal EN0. When the sequencer 412 of the memory chips 110_1 to 110_3 receives the first sequence signal S1T, the sequencer 412 keeps the pull-down switch transistors PD1 to PD3 off via the switch signals T1 to T3 and turn on the pull-up switching transistors PU1 to PU3 and the switches SW1 to SW3 via the switch signals S1 to S3 and the switch signals EN1 to EN3, respectively.

The following Table (3) illustrates the relationship between the number of chip connections and the voltage on the RWDS pin 164 after the pull-up resistor switch circuits and pull-down resistor switch circuits are configured to be turned on.

TABLE 3

| Number of chip connections | Voltage on RWDS pin |
| --- | --- |
| 1 | 0.33*VDD |
| 2 | 0.5*VDD |
| 3 | 0.6*VDD |
| 4 | 0.67*VDD |

The second sequence signal S2T may indicate entering the monitoring state Monitor. When the level detector circuit 414 receives the second sequence signal S2T, the range of the voltage on the RWDS pin 164 may be determined via the comparator. For example, when the comparators 424_0 to 424_3 in each of the memory chips 110_0 to 110_3 compare with the reference voltage VREF and determine that the range of the voltage on the RWDS pin 164 is between 0 and 0.415*VDD, a number of chip connections of 1 may be stored in the register inside the corresponding level detector circuit 414 as the determination result. When the comparators 424_0 to 424_3 in each of the memory chips 110_0 to 110_3 compare with the reference voltage VREF and determine that the range of the voltage on the RWDS pin is between 0.415*VDD and 0.55*VDD, a number of chip connections of 2 may be stored in the register inside the level detector circuit 414 as the determination result. When the comparators 424_0 to 424_3 in each of the memory chips 110_0 to 110_3 compare with the reference voltage VREF and determine that the range of the voltage on the RWDS pin is between 0.55*VDD and 0.635*VDD, a number of chip connections of 3 may be stored in the register inside the level detector circuit 414 as the determination result. When the comparators 424_0 to 424_3 in each of the memory chips 110_0 to 110_3 compare with the reference voltage VREF and determine that the range of the voltage on the RWDS pin is greater than 0.635*VDD, a number of chip connections of 4 may be stored in the register inside the level detector circuit 414 as the determination result. In the embodiment of FIG. 10, since the voltage on the RWDS pin is 0.67*VDD, the level detector circuit 414 may detect that the range of the voltage is greater than 0.635*VDD, thereby determining that the number of chip connections is 4.

The end signal SF indicates entering the end state FIN. When the level detector circuit 414 receives the end signal SF, the level detector circuit 414 may generate the corresponding state information SI according to the determination result stored in the internal register. As a result, the chip number identification circuit 410 may identify the current number of chip connections according to the state information SI, and find the selected trimming shift value SL from the look-up table storage device 130 accordingly. The end signal SF may also cause each device in the chip number identification circuit 410 to end the identification procedure of the number of chip connections.

Figure 11:
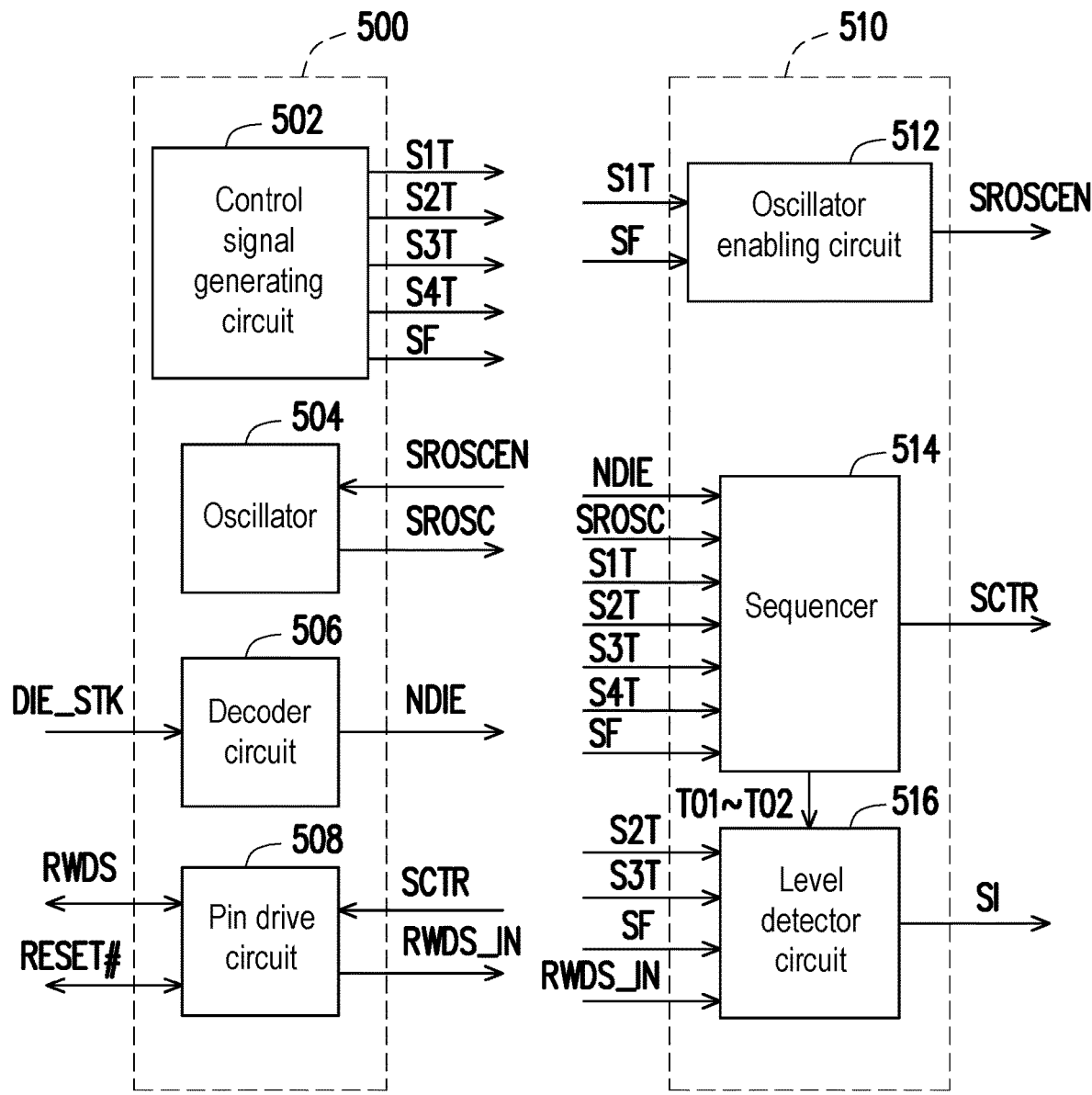
FIG. 11 shows a schematic circuit diagram of a chip number identification circuit and a control logic circuit of an embodiment of the invention.

Referring to FIG. 11, a control logic circuit 500 of the fourth embodiment of the invention includes a control signal generating circuit 502, an oscillator 504, a decoder circuit 506, and a pin drive circuit 508. A chip number identification circuit 510 includes an oscillator enabling circuit 512, a sequencer 514, and a level detector circuit 516.

The decoder circuit 506 may receive the chip identification signal DIE_STK, determine the order of the associated memory chip according to the chip identification signal DIE_STK, and provide the chip decoding signal NDIE accordingly.

The pin drive circuit 508 is coupled to the corresponding RWDS pin 164 and the RESET# pin 168. The pin drive circuit 508 is controlled by the control signal SCTR of the chip number identification circuit 510 to adjust the voltage level of the RWDS pin 164. Moreover, the pin drive circuit 508 may input the read/write data strobe signal RWDS on the RWDS pin 164 to the level detector circuit 516 as the input signal RWDS_IN.

Figure 12:
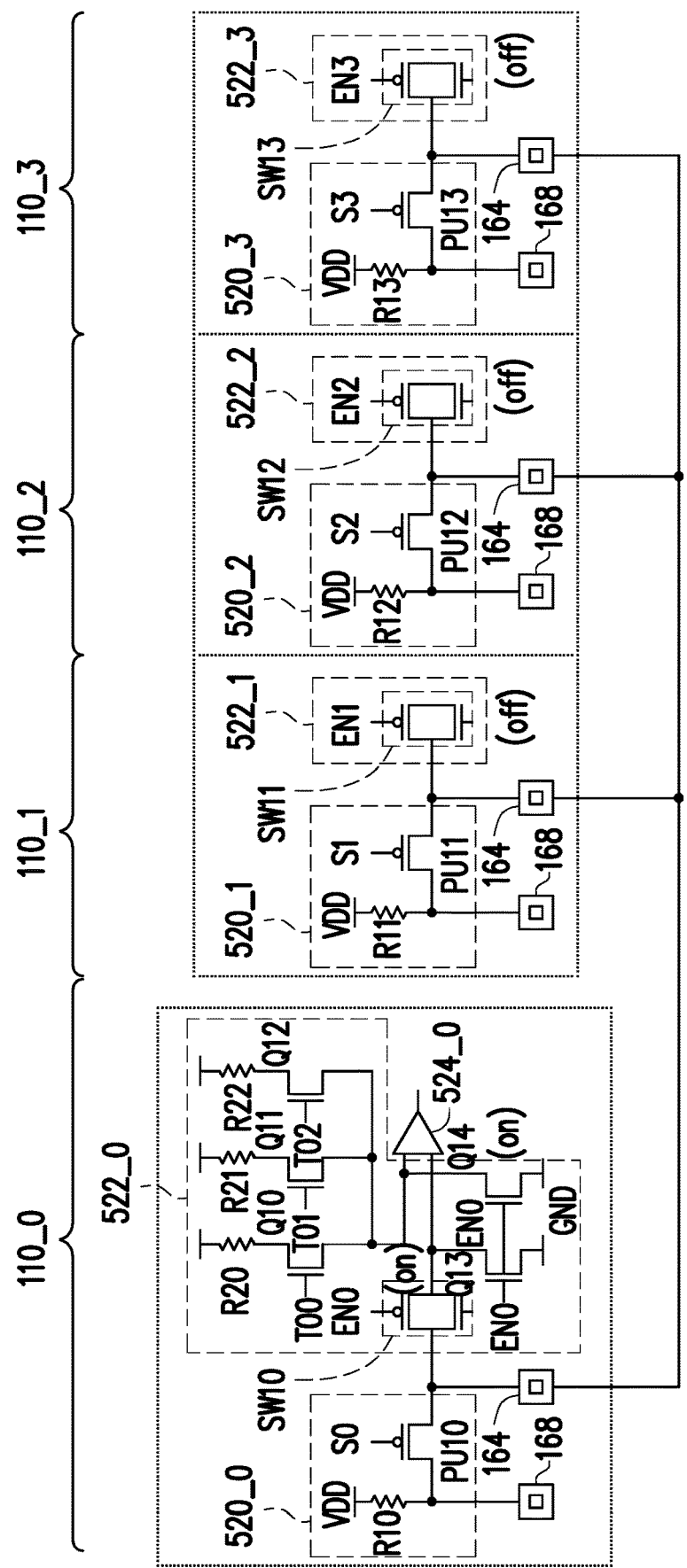
FIG. 12 shows a schematic load circuit diagram of an RWDS pin of an embodiment of the invention.

FIG. 12 shows a schematic load circuit diagram of an RWDS pin of an embodiment of the invention. The pin drive circuit 508 of the memory chip 110_0 includes a pull-up resistor switch circuit 520_0. The pull-up resistor switch circuit 520_0 is coupled to the corresponding RWDS pin 164 and the RESET# pin 168. The pull-up resistor switch circuit 520_0 includes a resistor R10 and a pull-up switch transistor PU10. The first terminal of the resistor R10 is coupled to the operating voltage VDD. The second terminal of the resistor R10 is coupled to the RESET# pin 168 and the first terminal of the pull-up switch transistor PU10. The second terminal of the pull-up switch transistor PU10 is coupled to the RWDS pin 164.

Similarly, the pin drive circuit 508 of the memory chips 110_1 to 110_3 includes pull-up resistor switch circuits 520_1 to 520_3. The pull-up resistor switch circuits 520_1 to 520_3 respectively include resistors R11 to R13 and pull-up switch transistors PU11 to PU13, and the circuit structure thereof may be the same as that of the pull-up resistor switch circuit 520_0. The resistors R10 to R13 are, for example, 100 kohms.

The level detector circuit 516 of the memory chip 110_0 includes a reference voltage circuit 522_0 and a comparator 524_0. The reference voltage circuit 522_0 is coupled to the corresponding RWDS pin 164 and the comparator 524_0. The reference voltage circuit 522_0 includes a switch SW10, transistors Q10 to Q14, and resistors R20 to R22. The transistors Q10 to Q12 are connected in series with the resistors R20 to R22 and then connected to the first input terminal of the comparator 524_0 in parallel. One terminal of the switch SW10 is coupled to the RWDS pin 164, and the other terminal of the switch SW10 is coupled to the second input terminal of the comparator 524_0. The transistors Q13 and Q14 are respectively connected across the first and second input terminals of the comparator 524_0 and the ground voltage GND, and are turned on or off under the control of the switch signal EN0.

Similarly, the level detector circuit 516 of the memory chips 110_1 to 110_3 may also include reference voltage circuits 522_1 to 522_3 and the comparator 524_0, and the circuit structure may be the same as the reference voltage circuit 522_0 and the comparator 524_0. In addition, the RWDS pins 164 of the memory chips 110_0 to 110_3 are connected to each other.

Figure 13:
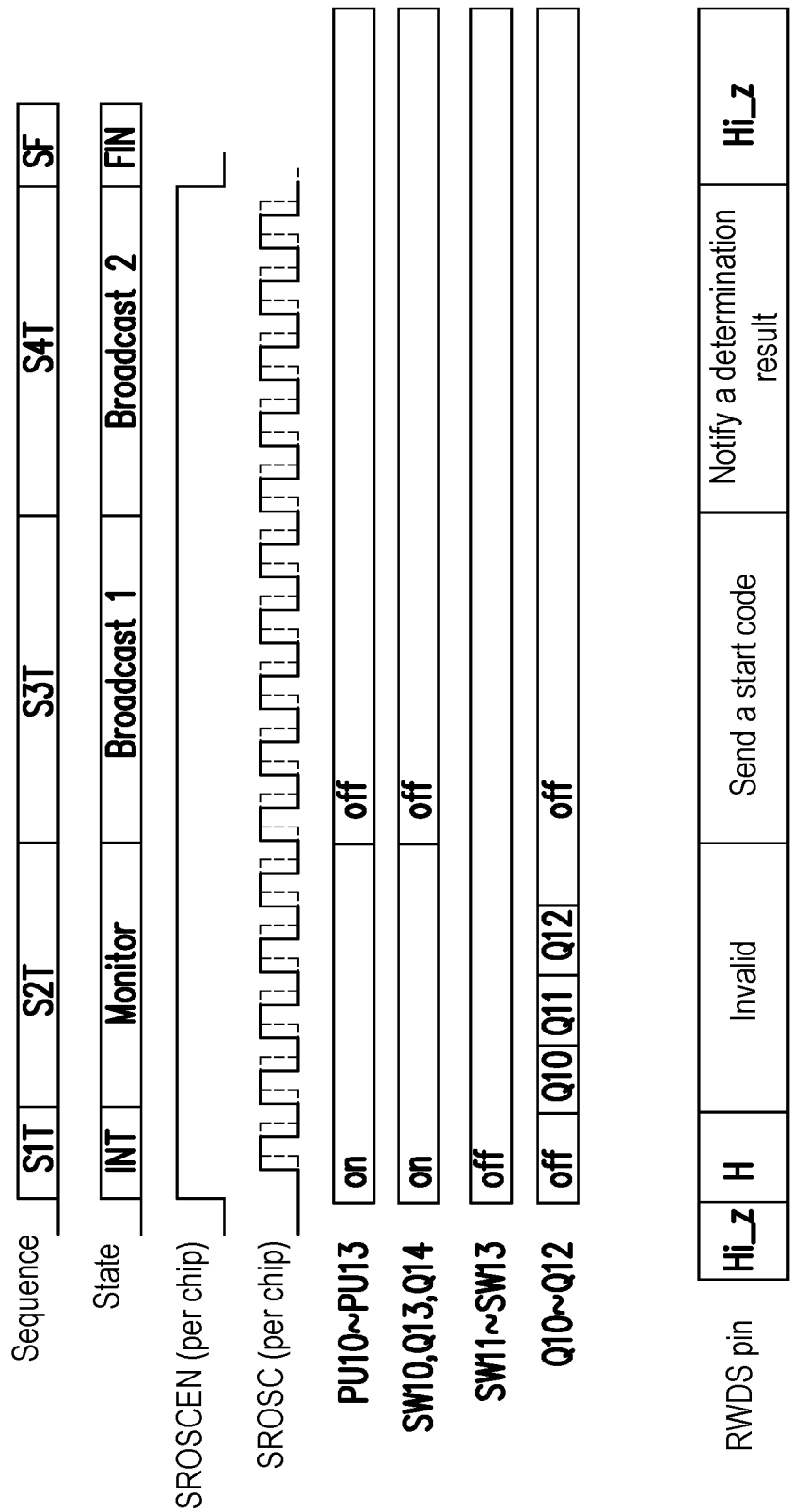
FIG. 13 shows a schematic operation diagram of a chip number identification circuit and a control logic circuit of an embodiment of the invention.

As shown in FIG. 13, in the present embodiment, when the memory system is activated, during the power on procedure, the control signal generating circuit 502 may provide the first sequence signal S1T, the second sequence signal S2T, the third sequence signal S3T, a fourth sequence signal S4T, and the end signal SF (first control signal) sequentially to control the chip number identification circuit 510 to execute the identification procedure of the number of chip connections.

Please refer to FIG. 2 and FIG. 11 to FIG. 13 at the same time. In the present embodiment, the first sequence signal S1T may indicate entering the initial state INT. When the oscillator enabling circuit 512 receives the first sequence signal S1T, the oscillator enabling circuit 512 may output the oscillation enabling signal SROSCEN to the oscillator 504 so that the oscillator 504 provides the oscillation signal SROSC.

When the sequencer 514 receives the first sequence signal S1T, the sequencer 514 may provide the second control signal SCTR according to the chip decoding signal NDIE, and enable the pin driving circuit 508 via the second control signal SCTR. Moreover, the second control signal SCTR provided by the sequencer 514 of the memory chip 110_0 includes the switch signals the S0 and EN0. As shown in FIG. 12, the pull-up switch transistor PU10 is turned on or off under the control of the switch signal S0. The switch SW10 is turned on or off under the control of the switch signal EN0. When the sequencer 514 of the memory chip 110_0 receives the first sequence signal S1T, the sequencer 514 of the memory chip 110_0 turns on the pull-up switch transistor PU10, the switch SW10, the transistor Q13, and the transistor Q14 via the switch signals S0 and EN0.

Similarly, the second control signal SCTR provided by the sequencer 514 of the memory chips 110_1 to 110_3 also includes the switch signals S1 to S3 and the switch signals EN1 to EN3, respectively. The difference from the operation of the memory chip 110_0 is that when the sequencer 514 of the memory chips 110_1 to 110_3 receives the first sequence signal S1T, the sequencer 514 of the memory chips 110_1 to 110_3 turns on the pull-up switch transistors PU11 to PU13 via the switch signals S1 to S3. However, switches SW11 to SW13 in the reference voltage circuits 522_1 to 522_3 are respectively turned off via the switch signals EN1 to EN3.

The second sequence signal S2T may indicate entering the monitoring state Monitor. When the second sequence signal S2T is received, the sequencer 514 may sequentially generate switch signals T00 to T02 according to the chip decoding signal NDIE in response to the oscillation signal SROSC. Specifically, the sequencer 514 may determine the order of the associated memory chip according to the chip decoding signal NDIE. In the present embodiment, only the sequencer 514 of the memory chip 110_0 sequentially generates the switch signals T00 to T02. At this time, the reference voltage circuit 522_0 in the memory chip 110_0 may provide different reference voltages to the comparator 524_0 in a predetermined sequence according to the switch signals T00 to T02. For example, the resistor R20 is 75 kohms, the resistor R21 is 41.5 kohms, and the resistor R22 is 29 kohms. The transistors Q10 to Q12 are sequentially turned on according to the switch signals T00 to T02, respectively, to provide the corresponding reference voltage to the comparator 524_0.

When the level detector circuit 516 of the memory chip 110_0 receives the second sequence signal S2T, the comparator 524_0 may sequentially compare the reference voltage provided by the reference voltage circuit 522_0 with the voltage on the RWDS pin 164 to determine the range of the voltage on the RWDS pin 164, thereby generating a determination result.

The third sequence signal S3T may indicate entering a first broadcast state Broadcast 1. When the third sequence signal S3T is received, the level detector circuit 516 of the memory chip 110_0 may send the determination result to the sequencer 514, and the sequencer 514 may transmit the start code to the other memory chips 110_1 to 110_3 via the RWDS pin 164.

The fourth sequence signal S4T may indicate entering a second broadcast state Broadcast 2. When the fourth sequence signal S4T is received, the sequencer 514 of the memory chip 110_0 may notify other memory chips 110_1 to 110_3 of the determination result via the RWDS pin, and store the determination result in the register inside the level detector circuit 516.

The end signal SF indicates entering the end state FIN. When the level detector circuit 516 receives the end signal SF, the level detector circuit 516 may generate the corresponding state information SI according to the determination result stored in the internal register. As a result, the chip number identification circuit 510 may identify the current number of chip connections according to the state information SI, and find the selected trimming shift value SL from the look-up table storage device 130 accordingly. The end signal SF may also cause each device in the chip number identification circuit 510 to end the identification procedure of the number of chip connections.

Figure 14:
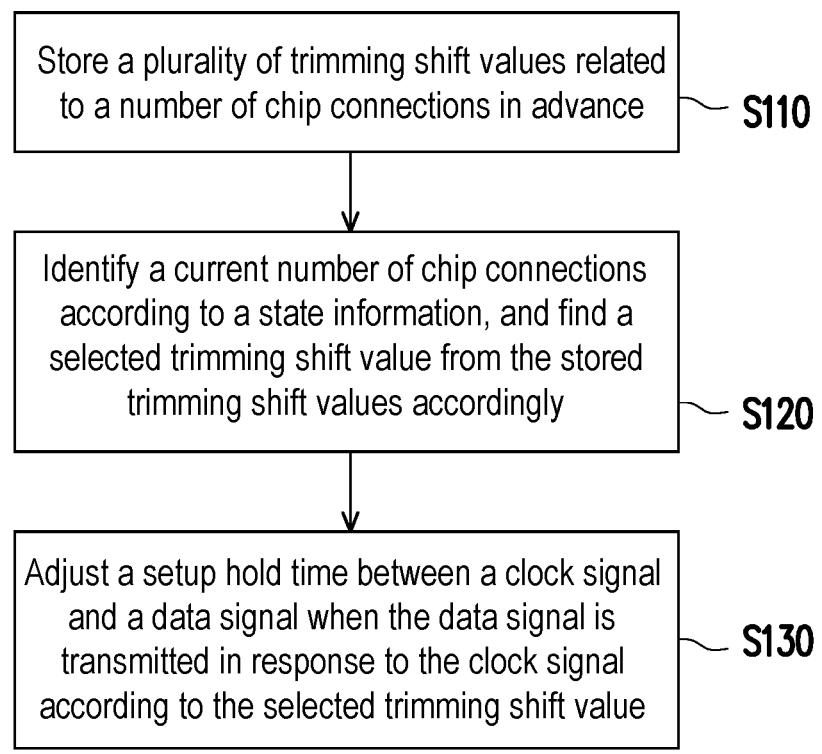
FIG. 14 shows a flowchart of an operation method of a memory system of an embodiment of the invention.

Referring to FIG. 14, the operation method of the memory system in the present embodiment includes the following steps. A plurality of trimming shift values related to a number of chip connections are stored in advance (step S110). Next, a current number of chip connections is identified according to a state information, and a selected trimming shift value is found from the stored trimming shift values accordingly (step S120). Lastly, a setup hold time between a clock signal and a data signal is adjusted when the data signal is transmitted in response to the clock signal according to the selected trimming shift value (step S130). In particular, for the implementation details of the above steps, refer to the embodiments of FIG. 1 to FIG. 13, which are not repeated herein.

Based on the above, in the case of a plurality of memory chips stacked in the same package structure, the memory system of the invention automatically identifies the number of connections of the memory chips, thereby adjusting the setup hold time to the most suitable length without using a specific fuse. Accordingly, the memory system has greater margin and durability in terms of setup hold time, and does not cause additional burden on the system, thereby avoiding the limitation of chip manufacture and inventory.

What is claimed is:

1. A memory system, comprising a plurality of memory chips connected to each other, each of the memory chips comprising:
    a memory array storing a data;
    a read/write data strobe pin connected to read/write data strobe pins of other memory chips;
    a look-up table storage device storing a plurality of trimming shift values related to a number of chip connections in advance;
    a chip number identification circuit coupled to the look-up table storage device and configured to identify a current number of chip connections according to a state information, and find a selected trimming shift value from the look-up table storage device accordingly; and
    a control logic circuit coupled to the memory array, the read/write data strobe pin, the look-up table storage device, and the chip number identification circuit, and configured to transmit a data signal in response to a clock signal and adjust a setup and hold time between the clock signal and the data signal according to the selected trimming shift value.

2. The memory system of claim 1, wherein each of the memory chips further comprises:
    a clock signal pin connected to clock signal pins of other memory chips and configured to receive the clock signal.

3. The memory system of claim 1, wherein the control logic circuit comprises:
    a chip number register configured to store the current number of chip connections and provide the stored number of current chip connections to the chip number identification circuit as the state information.

4. The memory system of claim 1, wherein the control logic circuit comprises:
    a control signal generating circuit configured to provide a first control signal to control the chip number identification circuit to execute an identification procedure of the number of chip connections;
    a decoder circuit configured to receive a chip identification signal, determine an order of an associated memory chip according to the chip identification signal, and provide a chip decoding signal accordingly; and
    a pin drive circuit coupled to a corresponding read/write data strobe pin and controlled by the chip number identification circuit to adjust a voltage level of the read/write data strobe pin.

5. The memory system of claim 4, wherein the first control signal comprises a first sequence signal, a second sequence signal, a third sequence signal, and an end signal, and is sequentially provided by the control signal generating circuit,
    wherein the control logic circuit further comprises:
        an oscillator providing an oscillation signal,
    wherein the chip number identification circuit comprises:
        a sequencer providing a second control signal when the second sequence signal is received and enabling the pin drive circuit via the second control signal, and triggering a corresponding pin drive circuit in a corresponding period according to the chip decoding signal in response to the oscillation signal when the third sequence signal is received, so that the pin drive circuit of each of the memory chips outputs a read/write data strobe signal to a respective read/write data strobe pin in a predetermined sequence to switch a voltage level of the read/write data strobe pin; and a counter circuit coupled to the sequencer and enabled when the second sequence signal is received to count a switch number of a voltage level of the read/write data strobe pin, wherein the counter circuits in the memory chips simultaneously count a switch number of a voltage level of corresponding read/write data strobe pins, and generate a corresponding state information when the end signal is received accordingly.

6. The memory system of claim 5, wherein the chip number identification circuit further comprises:

a pin clamp circuit clamping a corresponding read/write data strobe pin to a specified voltage according to the chip decoding signal when the first sequence signal is received.

7. The memory system of claim 4, wherein the first control signal comprises a first sequence signal, a second sequence signal, and an end signal, and is sequentially provided by the control signal generating circuit, wherein the chip number identification circuit comprises:
a sequencer providing a second control signal according to the chip decoding signal when the first sequence signal is received and enabling the pin drive circuit via the second control signal and adjusting a conduction degree of a corresponding pin drive circuit, so that the pin drive circuit of each of the memory chips has a different on-resistance value; and a level detector circuit determining a range of a voltage on the read/write data strobe pin when the second sequence signal is received, and generating a corresponding state information when the end signal is received accordingly.

8. The memory system of claim 7, wherein the second control signal comprises a first ON signal and a second ON signal, wherein the pin drive circuit comprises:
a P-type field-effect transistor, wherein a first terminal thereof receives an operating voltage, a second terminal of the P-type field-effect transistor is coupled to a corresponding read/write data strobe pin, and a control terminal of the P-type field-effect transistor receives the first ON signal; and an N-type field-effect transistor, wherein a first terminal thereof is coupled to a corresponding read/write data strobe pin, a second terminal of the N-type field-effect transistor is coupled to a ground voltage, and a control terminal of the N-type field-effect transistor receives the second ON signal.

9. The memory system of claim 4, wherein the first control signal comprises a first sequence signal, a second sequence signal, and an end signal, and is sequentially provided by the control signal generating circuit, wherein each of the memory chips further comprises:
a reset signal pin connected to reset signal pins of other memory chips and configured to receive a reset signal, wherein the pin drive circuit comprises:
a pull-up resistor switch circuit coupled to a corresponding read/write data strobe pin and the reset signal pin, wherein the chip number identification circuit comprises:
a level detector circuit comprising a pull-down resistor switch circuit and a comparator, wherein the pull-down resistor switch circuit is coupled to a corresponding read/write data strobe pin and the comparator; and a sequencer providing a second control signal according to the chip decoding signal when the first sequence signal is received, and enabling the pin drive circuit and turning on a corresponding pull-up resistor switch circuit and pull-down resistor switch circuit via the second control signal, when the second sequence signal is received, the level detector circuit determines a range of a voltage on the read/write data strobe pin via the comparator, and generates a corresponding state information when the end signal is received accordingly.

10. The memory system of claim 4, wherein the first control signal comprises a first sequence signal, a second sequence signal, a third sequence signal, a fourth sequence signal, and an end signal, and is sequentially provided by the control signal generating circuit, wherein each of the memory chips further comprises:
a reset signal pin connected to reset signal pins of other memory chips and configured to receive a reset signal, wherein the control logic circuit further comprises:
an oscillator providing an oscillation signal,
wherein the pin drive circuit comprises:
a pull-up resistor switch circuit coupled to a corresponding read/write data strobe pin and the reset signal pin, wherein the chip number identification circuit comprises:
a sequencer providing a second control signal according to the chip decoding signal when the first sequence signal is received and enabling the pin drive circuit via the second control signal, and sequentially generating a plurality of switch signals according to the chip decoding signal in response to the oscillation signal when the second sequence signal is received; and a level detector circuit comprising a reference voltage circuit and a comparator, wherein the reference voltage circuit provides different reference voltages in a predetermined sequence according to the switch signals, and the comparator is coupled to the reference voltage circuit, when the second sequence signal is received, the level detector circuit of the first memory chip sequentially compares the reference voltages provided by the reference voltage circuit with a voltage on the read/write data strobe pin via the comparator, in order to determine a range of a voltage on the read/write data strobe pin, thereby generating a determination result, wherein when the third sequence signal and the fourth sequence signal are received, the first memory chip notifies the other memory chips of the determination result via the read/write data strobe pin, and when the end signal is received, the level detector circuit generates a corresponding state information.

11. An operation method of a memory system, wherein the memory system comprises a plurality of memory chips connected to each other, a read/write data strobe pin of each of the memory chips is connected to read/write data strobe pins of other memory chips, and the operation method comprises:

storing a plurality of trimming shift values related to a number of chip connections in advance;

identifying a current number of chip connections according to a state information, and finding a selected trimming shift value from the stored trimming shift values accordingly; and adjusting a setup hold time between a clock signal and a data signal when the data signal is transmitted in response to the clock signal according to the selected trimming shift value.

12. The operation method of the memory system of claim 11, wherein a clock signal pin of each of the memory chips is connected to clock signal pins of other memory chips, and is configured to receive the clock signal.

13. The operation method of the memory system of claim 11, further comprising, before the step of identifying the current number of chip connections according to the state information:

storing the current number of chip connections and providing the current number of chip connections as the state information.

14. The operation method of the memory system of claim 11, further comprising, before the step of identifying the current number of chip connections according to the state information:

receiving a chip identification signal, determining an order of an associated memory chip according to the chip identification signal, and providing a chip decoding signal accordingly; and providing a first control signal to execute an identification procedure of the number of chip connections.

15. The operation method of the memory system of claim 14, wherein each of the memory chips comprises a pin drive circuit and a counter circuit coupled to the read/write data strobe pin, and the first control signal comprises a first sequence signal, a second sequence signal, a third sequence signal, and an end signal, the identification procedure of the number of chip connections comprises:

clamping a corresponding read/write data strobe pin to a specified voltage according to the chip decoding signal when the first sequence signal is received and starting to provide an oscillation signal;

providing a second control signal when the second sequence signal is received, and enabling the pin drive circuit and the counter circuit via the second control signal;

triggering a corresponding pin drive circuit in a corresponding period according to the chip decoding signal in response to the oscillation signal when the third sequence signal is received, so that the pin drive circuit of each of the memory chips outputs a read/write data strobe signal to a respective read/write data strobe pin in a predetermined sequence to switch a voltage level of the read/write data strobe pin; and counting a switch number of a voltage level of corresponding read/write data strobe pins simultaneously via the counter circuits in the memory chips, and generating a corresponding state information when the end signal is received accordingly.

16. The operation method of the memory system of claim 14, wherein each of the memory chips comprises a pin drive circuit coupled to the read/write data strobe pin, and the first control signal comprises a first sequence signal, a second sequence signal, and an end signal, the identification procedure of the number of chip connections comprises:

providing a second control signal according to the chip decoding signal when the first sequence signal is received and enabling the pin drive circuit via the second control signal and adjusting a conduction degree of a corresponding pin drive circuit, so that the pin drive circuit of each of the memory chips has a different on-resistance value; and determining a range of a voltage on the read/write data strobe pin when the second sequence signal is received, and generating a corresponding state information when the end signal is received accordingly.

17. The operation method of the memory system of claim 14, wherein each of the memory chips comprises a pull-up resistor switch circuit and a pull-down resistor switch circuit coupled to the read/write data strobe pin, and the first control signal comprises a first sequence signal, a second sequence signal, and an end signal, the identification procedure of the number of chip connections comprises:

providing a second control signal according to the chip decoding signal when the first sequence signal is received, and turning on a corresponding pull-up resistor switch circuit and pull-down resistor switch circuit via the second control signal; and determining a range of a voltage on the read/write data strobe pin when the second sequence signal is received, and generating a corresponding state information when the end signal is received accordingly.

18. The operation method of the memory system of claim 14, wherein each of the memory chips comprises a pull-up resistor switch circuit coupled to the read/write data strobe pin, and the first control signal comprises a first sequence signal, a second sequence signal, a third sequence signal, a fourth sequence signal, and an end signal, the identification procedure of the number of chip connections comprises:

starting to provide an oscillation signal when the first sequence signal is received, generating a plurality of switch signals sequentially according to the chip decoding signal in response to the oscillation signal when the second sequence signal is received;

providing different reference voltages in a predetermined sequence according to the switch signals, and comparing the reference voltages with a voltage on the read/write data strobe pin of the first memory chip sequentially, to determine a range of a voltage on the read/write data strobe pin, thereby generating a determination result;

notifying the other memory chips of the determination result via the read/write data strobe pin of the first memory chip when the third sequence signal and the fourth sequence signal are received, and generating a corresponding state information accordingly when the end signal is received.

* * * * *